(12) United States Patent
Peng et al.

(10) Patent No.: US 8,920,684 B2
(45) Date of Patent: Dec. 30, 2014

(54) AL-SB-TE PHASE CHANGE MATERIAL USED FOR PHASE CHANGE MEMORY AND FABRICATION METHOD THEREOF

(75) Inventors: Cheng Peng, Shanghai (CN); Liangcai Wu, Shanghai (CN); Feng Rao, Shanghai (CN); Zhitang Song, Shanghai (CN); Bo Liu, Shanghai (CN); Xilin Zhou, Shanghai (CN); Min Zhu, Shanghai (CN)

(73) Assignee: Shanghai Institute of Microsystem and Information Technology, Chinese Academy of Sciences, Shanghai (CN)

( * ) Notice: Subject to any disclaimer, the term of this patent is extended or adjusted under 35 U.S.C. 154(b) by 0 days.

(21) Appl. No.: 13/202,953

(22) PCT Filed: Jun. 24, 2011

(86) PCT No.: PCT/CN2011/076300
§ 371 (c)(1),
(2), (4) Date: Aug. 23, 2011

(87) PCT Pub. No.: WO2012/088853
PCT Pub. Date: Jul. 5, 2012

(65) Prior Publication Data
US 2013/0334469 A1 Dec. 19, 2013

(30) Foreign Application Priority Data
Dec. 31, 2010 (CN) .......................... 2010 1 0619496

(51) Int. Cl.
*H01B 1/02* (2006.01)
*G11C 11/56* (2006.01)
*C23C 14/06* (2006.01)
*C23C 14/35* (2006.01)
*C01B 19/00* (2006.01)
*C23C 14/14* (2006.01)
*H01L 45/00* (2006.01)
*G11C 13/00* (2006.01)

(52) U.S. Cl.
CPC ............ *G11C 11/56* (2013.01); *C23C 14/0623* (2013.01); *C23C 14/35* (2013.01); *C01B 19/007* (2013.01); *C23C 14/14* (2013.01); *H01L 45/06* (2013.01); *H01L 45/144* (2013.01); *G11C 13/0004* (2013.01)

USPC .................. 252/519.14; 252/512; 252/519.4; 423/508; 423/510; 204/192.15

(58) Field of Classification Search
CPC ....... G11C 11/56; C01B 19/007; C23C 14/14
USPC .......... 252/519.4, 519.14, 512; 423/508, 510; 204/192.15
See application file for complete search history.

(56) References Cited

U.S. PATENT DOCUMENTS

| 6,996,052 | B1 * | 2/2006 | Mizuno et al. | 369/275.1 |
| 7,859,893 | B2 * | 12/2010 | Liu et al. | 365/163 |
| 2006/0140094 | A1 * | 6/2006 | Tabata et al. | 369/59.1 |
| 2009/0180314 | A1 * | 7/2009 | Liu | 365/163 |
| 2009/0220744 | A1 * | 9/2009 | Martinez et al. | 428/156 |

FOREIGN PATENT DOCUMENTS

| CN | 101339783 A | * | 1/2009 |
| CN | 101109056 B | * | 8/2010 |
| CN | 101055740 B | * | 10/2010 |
| CN | 101587905 B | * | 5/2012 |
| WO | WO 2012088853 A1 | * | 7/2012 |

* cited by examiner

*Primary Examiner* — Douglas McGinty
(74) *Attorney, Agent, or Firm* — Ming Chow; Sinorica, LLC

(57) ABSTRACT

The present invention discloses an Al—Sb—Te phase change material used for PCM and fabrication method thereof. Said phase change material, which can be prepared by PVD, CVD, ALD, PLD, EBE, and ED, is a mixture of three elements aluminum (Al), antimony (Sb) and tellurium (Te) with a general formula of $Al_x(Sb_yTe_1)_{1-x}$, where $0<x\le0.85$, $0.67\le y\le7$. Said material is electrically driven from outside. By adjusting the content of three elements in the mixture, storage materials with different crystallization temperatures, melting temperatures and activation energies of crystallization can be achieved. Any two elements of aluminum, antimony and tellurium can be bonded to each other, so the adjustability is very high, maintaining the phase change properties in a wide range. Compared with conventional $Ge_2Sb_2Te_5$, the materials achieved by properly adjusting the element ratio in $Al_x(Sb_yTe_1)_{1-x}$ have higher crystallization temperatures, better thermal stability and data retention, and lower melting temperatures, while at the same time inheriting the fast phase change capability from $Sb_yTe_1$. Moreover, as a common element used in microelectronics, aluminum (Al) features mature technology and nice compatibility with CMOS.

4 Claims, 2 Drawing Sheets

AL-SB-TE PHASE CHANGE MATERIAL USED FOR PHASE CHANGE MEMORY AND FABRICATION METHOD THEREOF

FIELD OF THE INVENTION

This invention relates to a phase change thin film used in the microelectronics field and fabrication method thereof, and more particularly to a phase change thin film composed of a mixture of aluminum-antimony-tellurium and fabrication method thereof.

BACKGROUND OF THE INVENTION

Memory enjoys a significant position in the semiconductor market, 10% of which is occupied by dynamic random access memory (DRAM) and flash alone. With the gradual popularity of portable electronic devices, a growing market for non-volatile memory can be expected, coupled with increasingly high requirements of consumers for the capacity, speed and etc. of memory. As a mainstream non-volatile memory, flash technology has encountered the bottleneck. The technical weakness becomes more highlighted with the development of integrated circuits. Limitations such as low speed, high write voltage and limited number of cycles have directly restricted further application of flash technology. Therefore, it is urgent to develop a novel memory technology to replace it so as to maintain the direction of development toward scaling down to small sizes for memory technology.

Phase change memory (PCM) technology, emerging in recent years and enjoying extensive application prospect, is a new kind of memory technology where phase change material is used as the storage medium; recently it is a hot point in memory research and is regarded as the most promising one to become the mainstream memory of the next generation. Since most of the phase change materials comprise chalcogen elements, they are also know as chalcogenide random access memory, considered as the semiconductor memory characterized by high speed, high density, low power consumption, high reliability, low cost and etc. Data storage of chalcogenide random access memory is realized by the reversible phase change between amorphous and polycrystalline states when phase change material is activated by applying energy, wherein the chalcogenide has high resistance in amorphous state and low resistance in polycrystalline state, thus PCM utilizes the resistance difference between the high and low resistance states to store "0" and "1".

$Ge_2Sb_2Te_2$ is a typical phase change material used for PCM, but it is found in actual applications that, due to great change of density and poor crystallization speed (about hundreds of ns generally) of $Ge_2Sb_2Te_2$ material during phase change, the erase and write speed and the device reliability are influenced; furthermore, low crystallization temperature of about 160° C. makes it difficult to be used under high temperature conditions. Therefore, $Ge_2Sb_2Te_2$ is not a prefect phase change material, especially for applications in certain special conditions.

To sum up, it is an urgent issue at present to develop novel phase change materials that can help devices simultaneously possess multiple advantages such as high speed, high reliability, high density, good thermal stability and low cost, or that demonstrate outstanding performance in certain aspects.

SUMMARY OF THE INVENTION

The main technical problem to be solved in the present invention is to provide an Al—Sb—Te phase change material used for PCM and fabrication method thereof. Said material is characterized by good thermal stability, high crystallization speed, low power consumption and nice compatibility with complementary metal-oxide semiconductor (CMOS) process.

In order to solve the foregoing technical problem, the present invention adopts the following technical scheme:

An Al—Sb—Te phase change material used for PCM, which is a mixture of three elements aluminum, antimony and tellurium.

Preferably, said phase change material has a general formula of $Al_x(Sb_yTe_1)_{1-x}$, where $0<x≤0.85$, $0.67≤y≤7$.

Preferably, any two elements of aluminum, antimony and tellurium of said phase change material are bonded to each other to form a ternary system.

Preferably, elements aluminum and antimony of said phase change material are bonded to each other to form AlSb semiconductor.

Preferably, reversible change in resistivity of said phase change material is achieved by employing electrical pulse.

The present invention further provides a fabrication method of the foregoing Al—Sb—Te phase change material used for PCM: preparing phase change material of $Al_x(Sb_yTe_1)_{1-x}$ by physical vapor deposition (PVD) (e.g., magnetron sputtering), chemical vapor deposition (CVD), atomic layer deposition (ALD), pulsed laser deposition (PLD), electron beam evaporation (EBE), and electro deposition (ED), where $0<x≤0.85$, $0.67≤y≤7$. Preferably, the phase change material of $Al_x(Sb_yTe_1)_{1-x}$ in the present invention is prepared by magnetron sputtering, where $0<x≤0.85$, $0.67≤y≤7$.

Preferably, multi-target co-sputtering is used in PVD; for example, co-sputtering with Al and Sb—Te alloy targets, or co-sputtering with Al, Sb and Te targets; in addition, sputtering with prepared single Al—Sb—Te alloy target can be used obviously.

The present invention has the advantages as the following:

The Al—Sb—Te phase change material provided by the present invention can realize reversible phase change between the high and low resistance states by employing electrical pulse from outside and perform the data storage by the resistance difference before and after phase change, wherein the phase change material, which serves as storage material, shows great difference between the high and low resistance states before and after reversible phase change under electrical pulse, facilitating peripheral circuits to easily discern between "0" and "1", thereby functioning as a relatively ideal PCM material.

Said Al—Sb—Te phase change material does not fix the ratio of any two elements, showing high adjustability and benefits in finding out the proper composition for excellent performance in all aspects. By adjusting the content of three elements, storage materials with different crystallization temperatures, melting temperatures, and activation energies of crystallization can be achieved; the resistance difference before and after phase change can be noticeably increased, wherein any two elements of aluminum, antimony and tellurium of said material can be bonded to each other to form a ternary system with a uniform crystallization temperature, and wherein elements aluminum and antimony can be bonded to each other to form AlSb semiconductor such that the thermal stability of the material can be enhanced to improve the activation energy and data retention. It can be found that this material not only shows small volume difference before and after phase change and high crystallization speed during phase change, but also has good data retention for stable operation under high temperature conditions.

Moreover, as a common element used in microelectronics, aluminum (Al) features mature technology, so Al—Sb—Te phase change material is well compatible with CMOS.

DETAILED DESCRIPTION OF THE EMBODIMENTS

The substantial characteristics and outstanding improvements of the present invention are further detailed below with reference to specific embodiment, however the present invention is not only restricted to the embodiment.

The present invention provides an aluminum-antimony-tellurium phase change material used for PCM, which has a general formula of $Al_x(Sb_yTe_1)_{1-x}$, wherein the content of Al can not be over 85%, i.e., x shall be preferably in the range of $0<x\leq0.85$, and the ratio of Sb to Te shall also be controlled within a certain range, preferably in the range of $0.67\leq y\leq 7$. This phase change material is a mixture thin film of three elements aluminum, antimony and tellurium, which can be prepared by various methods, such as PVD, CVD, ALD, PLD, EBE, and ED. Among the foregoing methods, PVD is a more flexible one of preparing thin film, wherein the thin film can be prepared by co-sputtering with three targets of Al, Sb and Te with the composition adjusted by controlling the source power of three targets, by co-sputtering with Al and Sb—Te alloy targets, or by sputtering with prepared single Al—Sb—Te alloy target; Al—Sb—Te phase change materials of various compositions can be prepared by these methods.

Embodiment 1

The technical scheme of the present invention is further detailed by the preparation of $Al_x(Sb_yTe_1)_{1-x}$ phase change material and the test thereof in this embodiment. Detailed preparation method is described as follow:

(1) Prepare Al—Sb—Te thin film on regular silicon substrate and thermally oxidized silicon substrate simultaneously by magnetron co-sputtering with two targets, wherein a base vacuum level is $1.8\times10^{-4}$ Pa and a sputtering argon pressure is 0.21 Pa. Film materials with three compositions are prepared under the conditions mentioned above, wherein the parameters of each composition is shown in the table below:

| Source power | Ar (sccm) | Film growth time (min) Film thickness(nm) | Composition | Rate (nm/min) |
|---|---|---|---|---|
| $Sb_{0.83}Te_1$-RF20w | 20 | 30/120 | $Sb_{0.83}Te_1$ | 4 |
| Al-DC15w $Sb_{0.83}Te_1$-RF20w | 20 | 30/150 | $Al_{0.58}$ $(Sb_{0.83}Te_1)_{0.42}$ | 5 |
| Al-DC15w $Sb_{0.83}Te_1$-RF20w Sb- RF20w | 20 | 30/210 | $Al_{0.75}$ $(Sb_{3.6}Te_1)_{0.25}$ | 7 |

Figure 1:
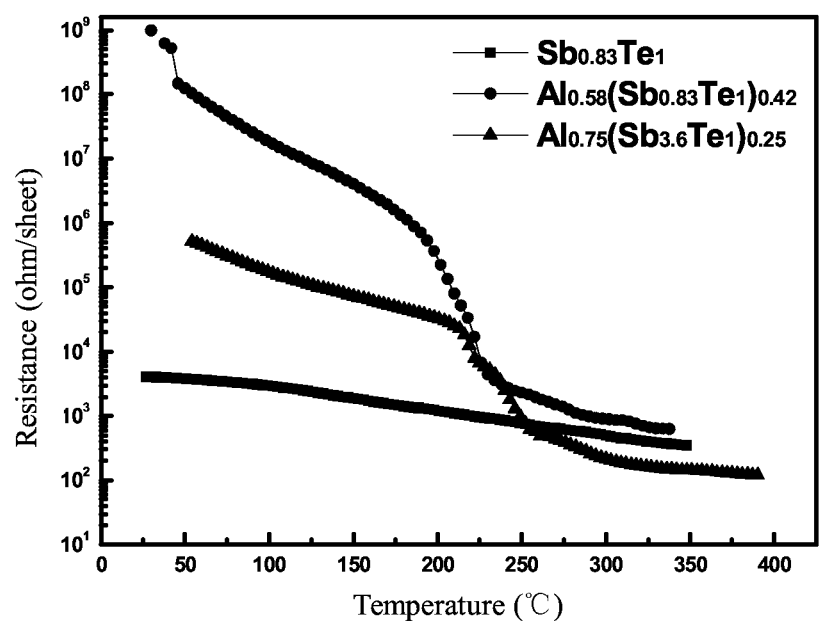
FIG. 1 is a plot of sheet resistance versus temperature for phase change thin film of $Al_x(Sb_yTe_1)_{1-x}$ with difference compositions in embodiment.

(2) The resistance of the as-deposited $Al_x(Sb_yTe_1)_{1-x}$ film grown on the oxidized silicon substrate is in situ measured, as shown in FIG. 1. It is shown that the resistance of $Sb_{0.83}Te_1$ deposition is very low and the resistance difference between the amorphous and crystalline states of phase change film is greatly enhanced by the doping of Al element, wherein the resistance difference of $Al_{0.58}(Sb_{0.83}Te_1)_{0.42}$ is greater than $10^6$, considerably facilitate the discerning between high and low resistance. In addition, apart from higher resistance in amorphous state and better thermal stability, the material of $Al_x(Sb_yTe_1)_{1-x}$ also shows a noticeable increase in the phase change speed around the crystallization temperature.

Figure 2A:
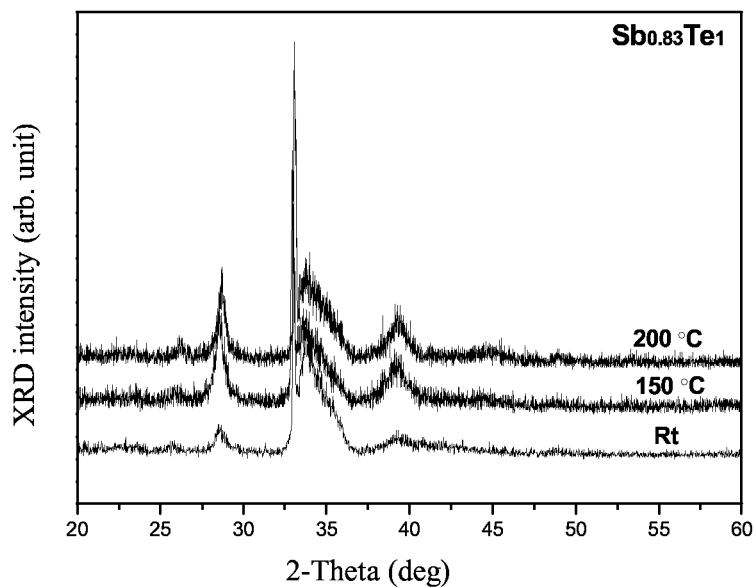
FIGS. 2a and 2b are XRD patterns of phase change thin films of $Al_{0.58}(Sb_{0.83}Te_1)_{0.42}$ and $Sb_{0.83}Te_1$ under different annealing temperatures.
Figure 2B:
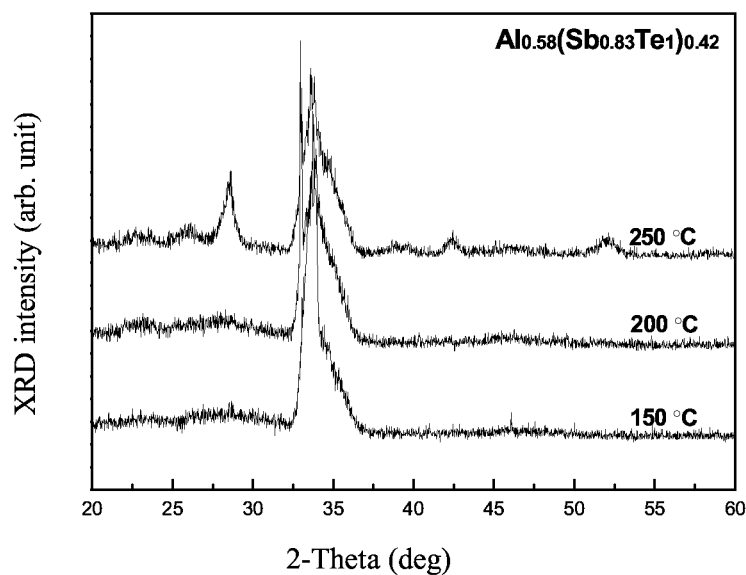

(3) The obtained thin films of $Sb_{0.83}Te_1$ and $Al_{0.58}(Sb_{0.83}Te_1)_{0.42}$ are annealed in pure nitrogen atmosphere at different temperatures for 5 minutes. The films after annealing are investigated by XRD diffraction, as shown in FIGS. 2a-2b. It is shown that the material of $Sb_{0.83}Te_1$ crystallizes even at room temperature, while noticeable change occurs to the crystal structure of $Al_{0.58}(Sb_{0.83}Te_1)_{0.42}$ only when the temperature is above 200° C., i.e., the crystallization temperature of $Al_{0.58}(Sb_{0.83}Te_1)_{0.42}$ is over 200° C. Compared with conventional $Ge_2Sb_2Te_5$ material, the crystallization temperature as well as the thermal stability of $Al_{0.58}(Sb_{0.83}Te_1)_{0.42}$ are significantly increased, indicating a market prospect of this material.

To sum up, said Al—Sb—Te phase change material used for PCM described in the present invention is characterized by small volume difference before and after phase change, high crystallization speed during phase change and good data retention for stable operation under high temperature conditions. Moreover, said phase change material can realize reversible phase change under electrical pulse, showing great difference between the high and low resistance states before and after phase change, facilitating peripheral circuits to easily discern between "0" and "1", thereby functioning as a relatively ideal PCM material.

The description and application of the present invention is only an illustration and is not to limit the present invention to the foregoing embodiment. Further modification and variation can be made to the embodiment disclosed herein and the substitutionally equivalent components of the embodiment are well known to ordinary one skilled in the art. It shall be understood to those skilled in the art that the present invention can be realized in other form, structure, layout, and ratio with other substrate, material and component without deviating from the spirit or substantial characteristics of the present invention. Modification and variation can be made to the embodiment disclosed herein without deviating from the spirit and scope of the present invention.

What is claimed is:

1. An Al—Sb—Te phase change material used for PCM, characterized in that said material is a mixture of three elements aluminum, antimony and tellurium, said material has a general formula of $Al_x(Sb_yTe_1)_{1-x}$, where $0.58 \leq x \leq 0.85$, $0.67 \leq y \leq 7$.

2. The Al—Sb—Te phase change material used for PCM according to claim 1, characterized in that any two elements of aluminum, antimony and tellurium of said material are bonded to each other to form a ternary system.

3. The Al—Sb—Te phase change material used for PCM according to claim 1, characterized in that elements aluminum and antimony of said material are bonded to each other to form AlSb semiconductor.

4. The Al—Sb—Te phase change material used for PCM according to claim 1, characterized in that reversible change in resistivity of said material is achieved by employing electrical pulse.

* * * * *